US006867476B2

(12) United States Patent
Lee

(10) Patent No.: US 6,867,476 B2
(45) Date of Patent: Mar. 15, 2005

(54) VERTICAL DOUBLE DIFFUSED MOSFET AND METHOD OF FABRICATING THE SAME

(75) Inventor: Sun-Hak Lee, Gyeonggi-do (KR)

(73) Assignee: Samsung Electronics Co., LTD, Suwon (KR)

( * ) Notice: Subject to any disclaimer, the term of this patent is extended or adjusted under 35 U.S.C. 154(b) by 0 days.

(21) Appl. No.: 10/396,348

(22) Filed: Mar. 26, 2003

(65) Prior Publication Data
US 2003/0219945 A1 Nov. 27, 2003

(30) Foreign Application Priority Data
May 22, 2002 (KR) .................................. 10-2002-0028478

(51) Int. Cl.$^7$ ............................................. H01L 29/00
(52) U.S. Cl. ..................................... 257/549; 257/288
(58) Field of Search ............................... 257/288, 296, 257/315, 328, 329, 330, 334, 336, 346, 347, 350, 352, 376, 401, 408, 549

(56) References Cited

U.S. PATENT DOCUMENTS 5,488,236 A * 1/1996 Baliga et al. ............... 257/132
5,945,709 A * 8/1999 Williams et al. ............ 257/343
6,239,463 B1 * 5/2001 Williams et al. ............ 257/328
6,586,801 B2 * 7/2003 Onishi et al. ............... 257/339

FOREIGN PATENT DOCUMENTS

| KR | 1999-0066314 | 8/1999 |
|---|---|---|
| KR | 000000936 A | 1/2000 |

* cited by examiner

Primary Examiner—David Nhu
(74) Attorney, Agent, or Firm—Volentine, Francos & Whitt, PLLC

(57) ABSTRACT

In a DMOS device, a drift region is located over a substrate and is lightly doped with impurities of a first conductivity type. A plurality of body areas are located in the drift region and doped with impurities of a second conductivity type which is opposite the first conductivity type. A plurality of source areas are respectively located in the body areas and heavily doped with impurities of the first conductivity type. A plurality of bulk areas are respectively located adjacent the source areas and in the body areas, and are heavily doped with impurities of the second conductivity type. A well region partially surrounds the body areas collectively and is doped with impurities of the first conductivity.

19 Claims, 14 Drawing Sheets

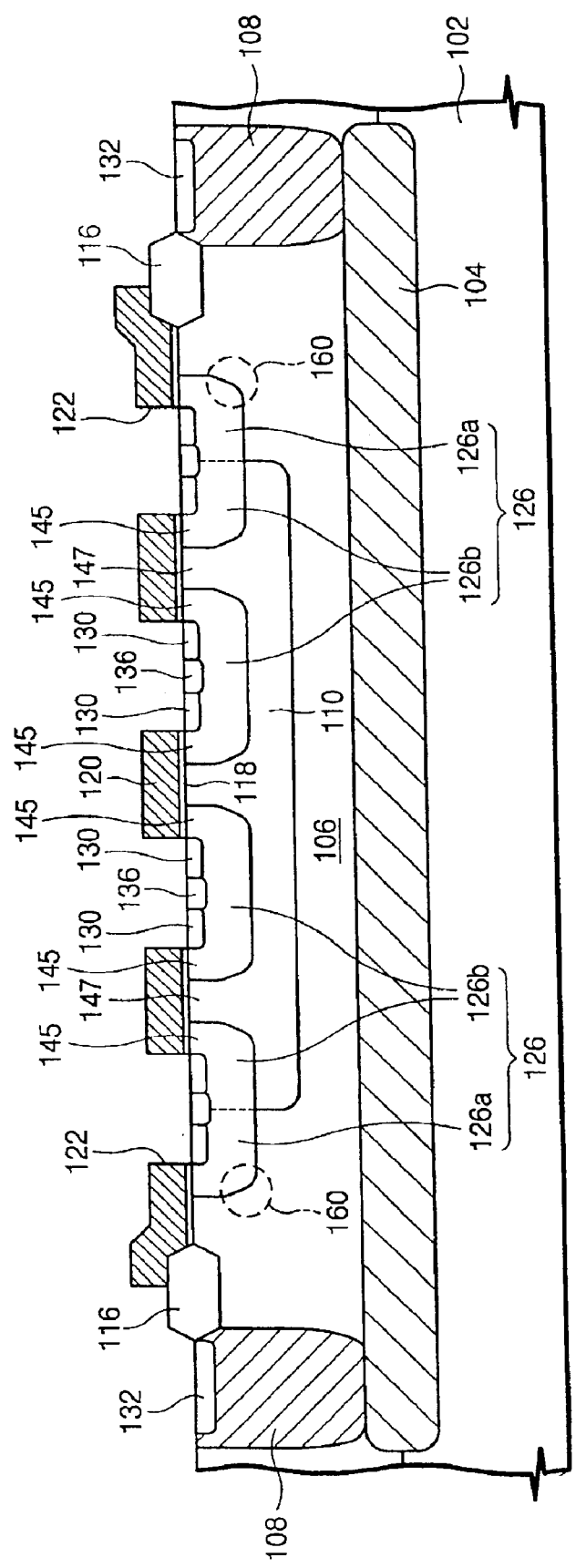

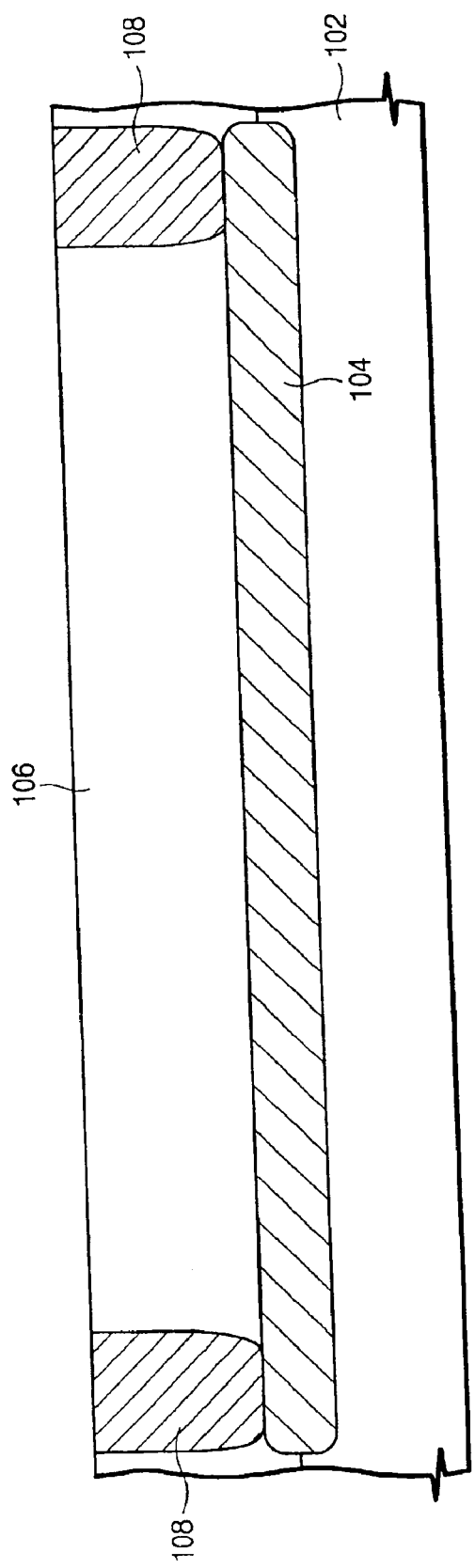

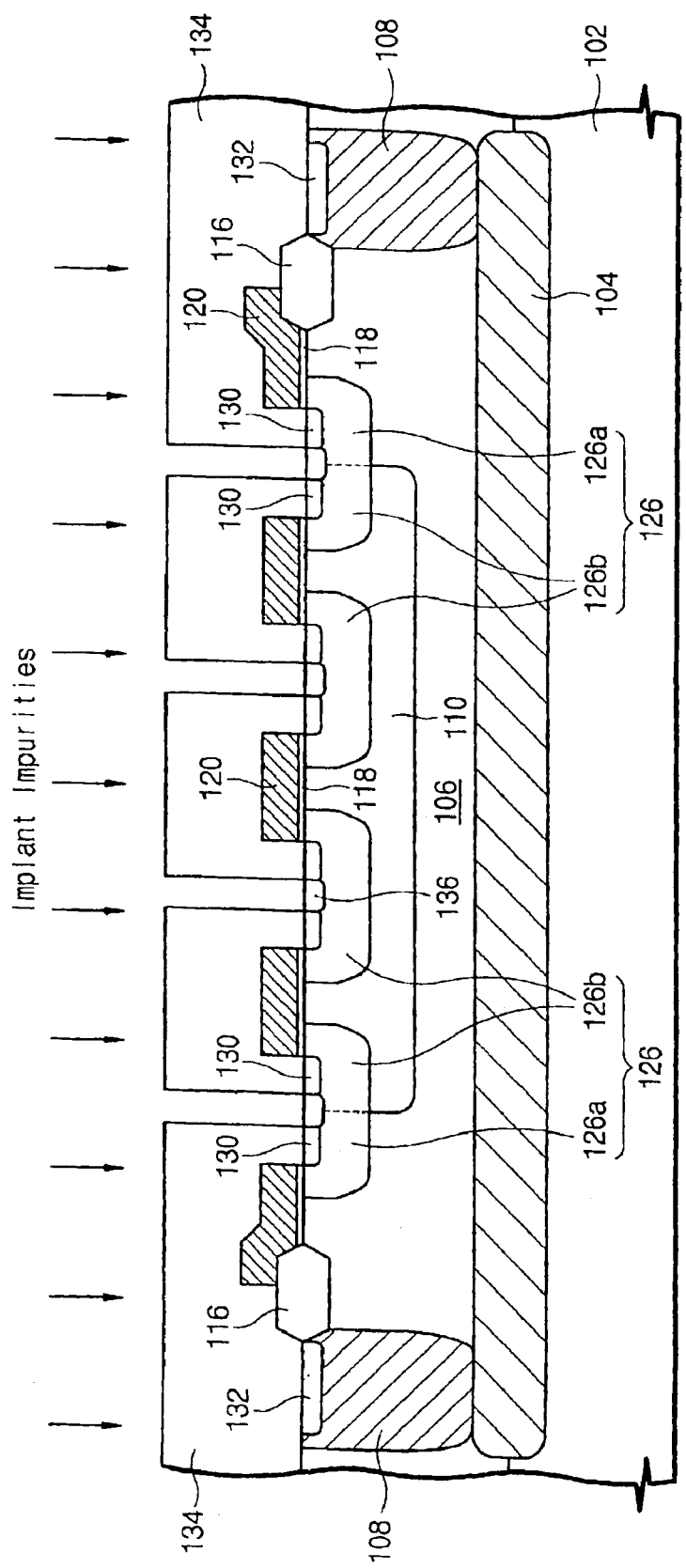

US 6,867,476 B2

VERTICAL DOUBLE DIFFUSED MOSFET AND METHOD OF FABRICATING THE SAME

BACKGROUND OF THE INVENTION

1. Field of the Invention

The present invention is generally directed to semiconductor devices and to methods of fabricating the same. More specifically, the present invention is directed to vertical double diffused metal oxide semiconductor (VDMOS) devices and to methods of fabricating the same.

2. Background of the Invention

In integrated circuit (IC) products, such as hard disk drives (HDD), video tape recorders (VTR), and so forth, double-diffused metal oxide semiconductor (DMOS) devices are widely used in power conversion and control systems requiring high-power transfer and high-speed switching.

Advantageously, DMOS devices exhibit a high-speed switching characteristic, even when operating at a low gate voltage, while having a relatively low on-resistance and a high breakdown voltage. The low-voltage input terminal of the DMOS device results in minimal power consumption.

FIG. 1A is a cross-sectional view of a conventional DMOS device, and FIG. 1B is a top plan view thereof. Particularly, FIG. 1A is cross-sectional view taken along a line I–I' of FIG. 1B.

Referring to FIG. 1A and FIG. 1B, an N-type buried layer 4 is formed at a semiconductor substrate 2. A drift region 6, which is lightly doped with N-type impurities, is epitaxially formed on the buried layer 4 and the substrate 2.

A plurality of P-type body areas 26 are formed at predefined areas of the drift region 6. A loop-shaped source area 30, which is heavily doped with N-type impurities, and a P-type bulk area 36, which is surrounded by the source area 30, are formed in each body area 26.

A sink area 8 is spaced from the outermost body areas 26, and is electrically connected to the buried layer 4 through the drift region 6. Between the sink area 8 and the outermost body area 26, a field oxide layer 16 is formed in contact with the sink area 8.

A drain area 32, which is heavily doped with N-type impurities, is formed on the sink area 8. The drain area 32 is loop-shaped and has a predetermined width, as shown in FIG. 1B. In the drain area 32, drain contacts 40 are formed at a constant spacing. The drain area 32 is connected to a drain electrode (not shown) through the drain contacts 40.

A gate electrode 20 is formed over a gate insulating layer 18 and the drift region 6, and is interposed between and partially overlaps the body areas 26. The gate electrode 20 is made of polysilicon. Also, an outer edge of the gate electrode partially overlaps the field oxide layer 16. The gate electrode 20 has a mesh-shaped structure in which a plurality of openings 22 are formed, as shown in FIG. 1B. A source contact 38 is formed in the respective openings 22 of the gate electrode 20. The source area 30 and the bulk area 36 are connected to a source electrode (not shown) through the source contact 38.

Returning to FIG. 1A, when a predetermined voltage is applied to a drain electrode and a gate electrode, electrons migrate from the source area 30 to a drain area 32 through a channel area 45, an accumulation region 47, the drift region 6, the buried layer 4, and the sink area 8.

Important electrical characteristics of the VDMOS device are an ON-resistance and a breakdown voltage. Here, the "ON-resistance" is the source-to-drain resistance when a transistor of the device is turned on.

The breakdown voltage is affected by the doping densities of the body area 26 and the drift region 6, and is structurally affected by the outermost body area 26 and the field oxide layer 16.

Reference is made to FIG. 1C for an explanation as to why the outermost body area 26 significantly affects the breakdown voltage. When the device operates at a high voltage, a depletion region 55 is formed at a P-N junction between the body area 26 and the drift region 6. The depletion region 55 is somewhat planar between the body areas 26, while having a curvature portion 60 outside the outermost body area 26. When a high voltage is applied to the DMOS device, an electric field concentrates on the curvature portion 60. Thus, the outermost body area 26 is vulnerable to a breakdown voltage. In FIG. 1C, the reference numeral and symbols '42', 'D', 'S', and 'G' represent an interlayer insulating film, a drain electrode 56, a source electrode 57, and a gate electrode 20, respectively.

An effective way to improve the ON-resistance is to increase a doping density of the drift region 6 to thereby reduce a resistance at the drift region 6. Unfortunately, this lowers the breakdown voltage. In the meantime, if the doping density of the drift region 6 is lowered to thereby increase the breakdown voltage, the ON-resistance is increased.

In other words, when setting of the doping density of the drift region 6, there is a trade-off between increasing the doping density to obtain a low ON-resistance and decreasing the doping density to obtain a high breakdown voltage.

SUMMARY OF THE INVENTION

In view of the foregoing, the present invention provides a DMOS device which has a relatively low ON-resistance while maintaining a stable breakdown voltage, and a method of fabricating the same.

According to an aspect of the invention, a DMOS device includes a drift region which is located over a substrate and which is lightly doped with impurities of a first conductivity type. A plurality of body areas are located in the drift region and doped with impurities of a second conductivity type which is opposite the first conductivity type. A plurality of source areas are respectively located in the body areas and heavily doped with impurities of the first conductivity type. A plurality of bulk areas are respectively located adjacent the source areas and in the body areas, and are heavily doped with impurities of the second conductivity type. A well region partially surrounds the body areas collectively and is doped with impurities of the first conductivity.

According to another aspect of the invention, a DMOS device includes a drift region which is located over the substrate and lightly doped with impurities of a first conductivity type. A plurality of body areas are located in the drift region and doped with impurities of a second conductivity type which is opposite the first conductivity type. A plurality of source areas are respectively located in the body areas and heavily doped with impurities of the first conductivity type. A plurality of bulk areas respectively are surrounded by the source areas and located in the body areas, and heavily doped with impurities of the second conductivity type. A well region partially surrounds the body areas collectively and is doped with impurities of the first conductivity. A buried layer of the first conductively type is interposed between the substrate and the drift region. A gate electrode has a plurality of openings respectively aligned over the source areas and the bulk areas, and a gate insulating layer is interposed between the drift region and the gate electrode. A sink area of the first conductivity type is connected to the buried layer through the drift region, and a drain area of the first conductivity type is located on the sink area.

According to still another aspect of the invention, a method of fabricating a DMOS device is provided which includes forming a drift region over a substrate, the drift region being lightly doped with impurities of a first conductivity type. A well of the first conductivity type is formed in an area of the drift region, and a plurality of body areas of a second conductivity type are formed in the drift region, where at least one of the body areas is formed across an edge of the well so as to be partially formed in the well and partially formed outside the well. A source area is formed in each of the body areas, the source areas being heavily doped with impurities of the first conductivity type, and a bulk area is formed in each of the body areas, the bulk areas being heavily doped with impurities of the second conductivity type and surrounded by the source areas.

According to yet another aspect of the present invention, a method of fabricating a DMOS device is provided which includes forming a heavily doped buried layer of a first conductivity type at an area of a substrate. A drift region of the first conductivity type is formed over the buried layer. A sink area of the first conductivity type is formed which is connected to the heavily doped buried layer through the drift region. A well of the first conductivity type is formed at an area of the drift region. A gate insulating layer and gate electrode are formed over the drift region, the gate electrode and gate insulating layer having a plurality of openings which expose areas of the drift region. A plurality of body areas are formed at the exposed areas of the drift region, wherein at least one of the body areas is formed across an edge of the well so as to be partially formed in the well and partially formed outside the well. A plurality of heavily doped sources areas of the first conductivity type are formed in the body areas. A drain area of the first conductivity type is formed in the sink area, and a plurality of heavily doped bulk areas of the second conductivity type are formed in the body areas, the bulk areas being surrounded by the source areas.

BRIEF DESCRIPTION OF THE DRAWINGS

The features and advantages of the present invention will become readily apparent from the detailed description that follows, with reference to the accompanying drawings, in which:

FIG. 2A and FIG. 2B are a cross-sectional view and a top plan view of a DMOS device according to an embodiment of the present invention, respectively; and FIG. 3A through FIG. 3I are cross-sectional views for explaining the fabrication of the DMOS device according to an embodiment of the present invention.

DETAILED DESCRIPTION OF THE PREFERRED EMBODIMENTS

Figure 1A:
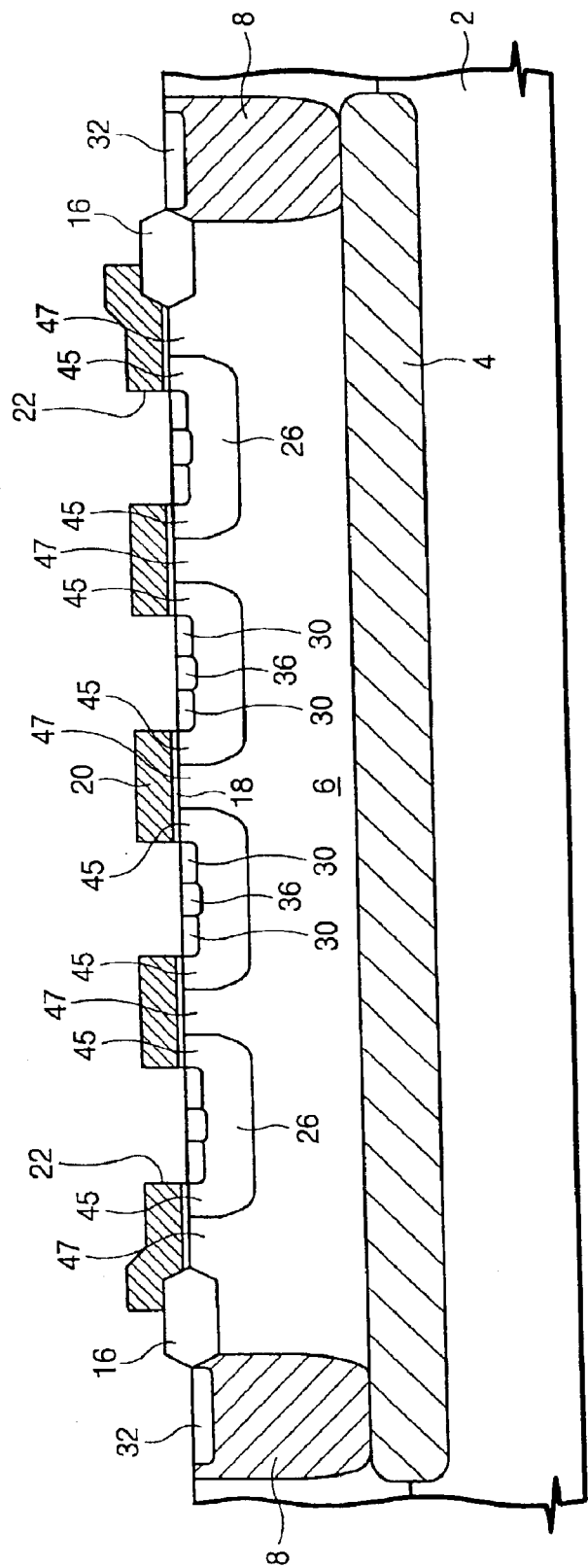
FIG. 1A and FIG. 1B are a cross-sectional view and a top plan view of a conventional DMOS device, respectively.
Figure 1B:
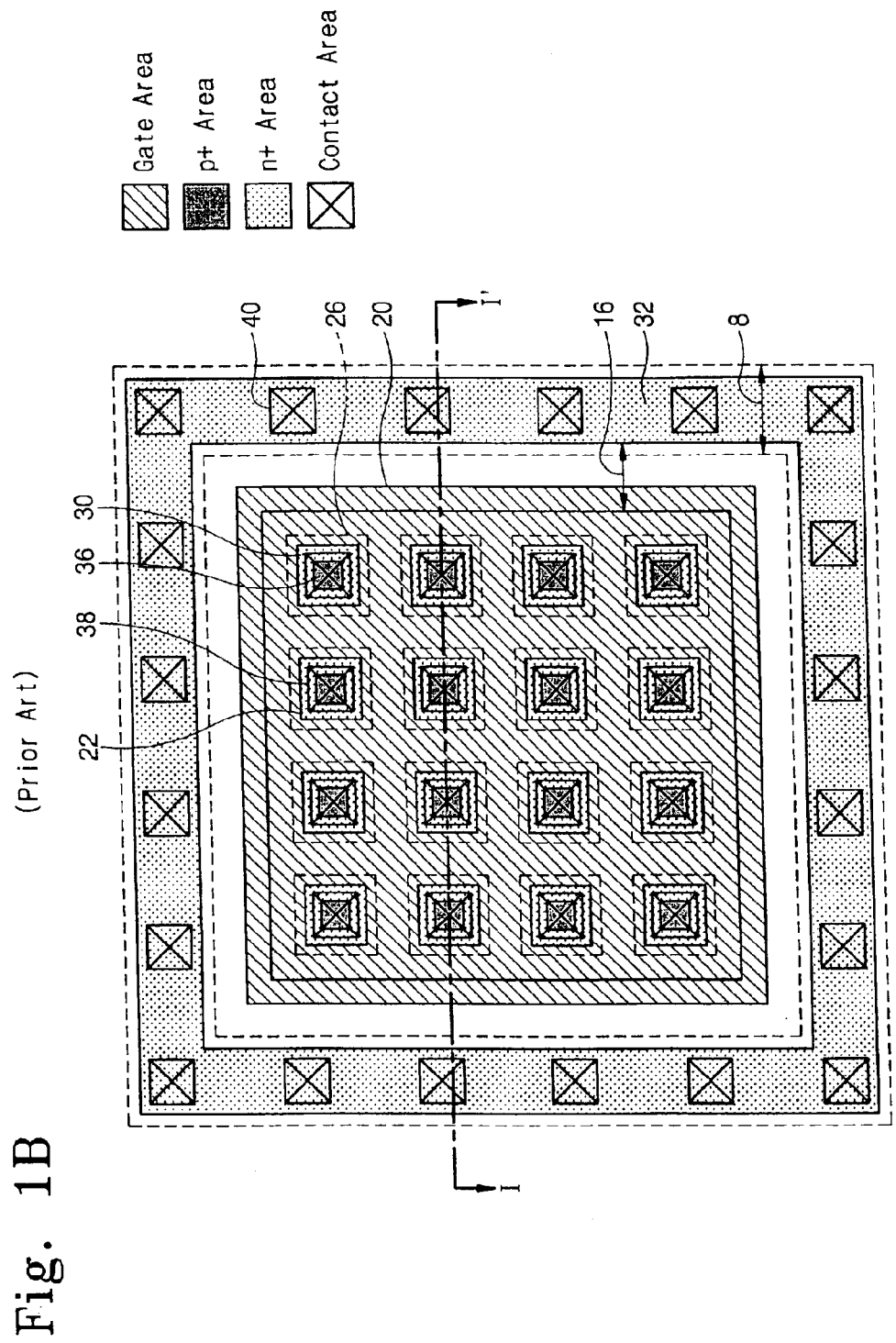
Figure 1C:
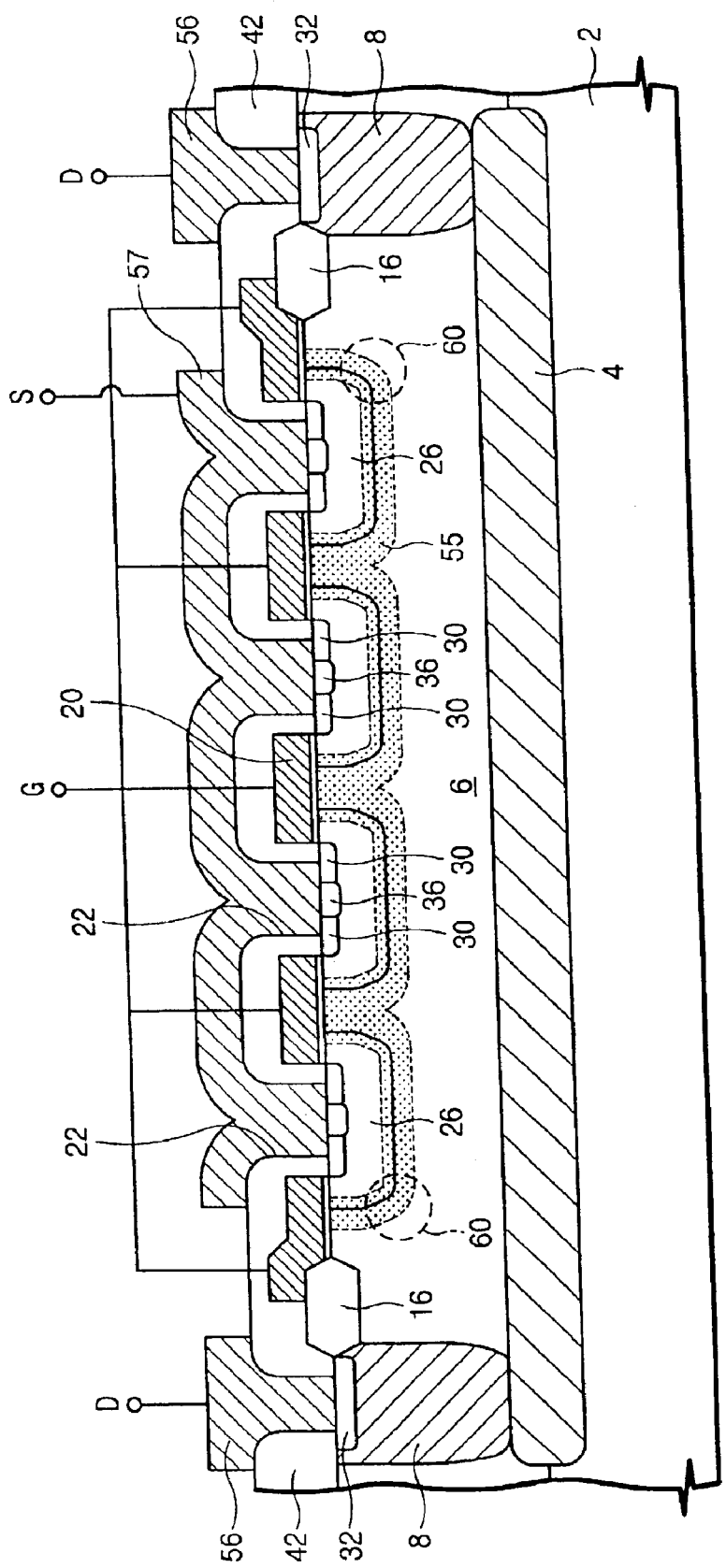
FIG. 1C is a cross-sectional view for explaining disadvantages of the conventional DMOS device.
Figure 2B:
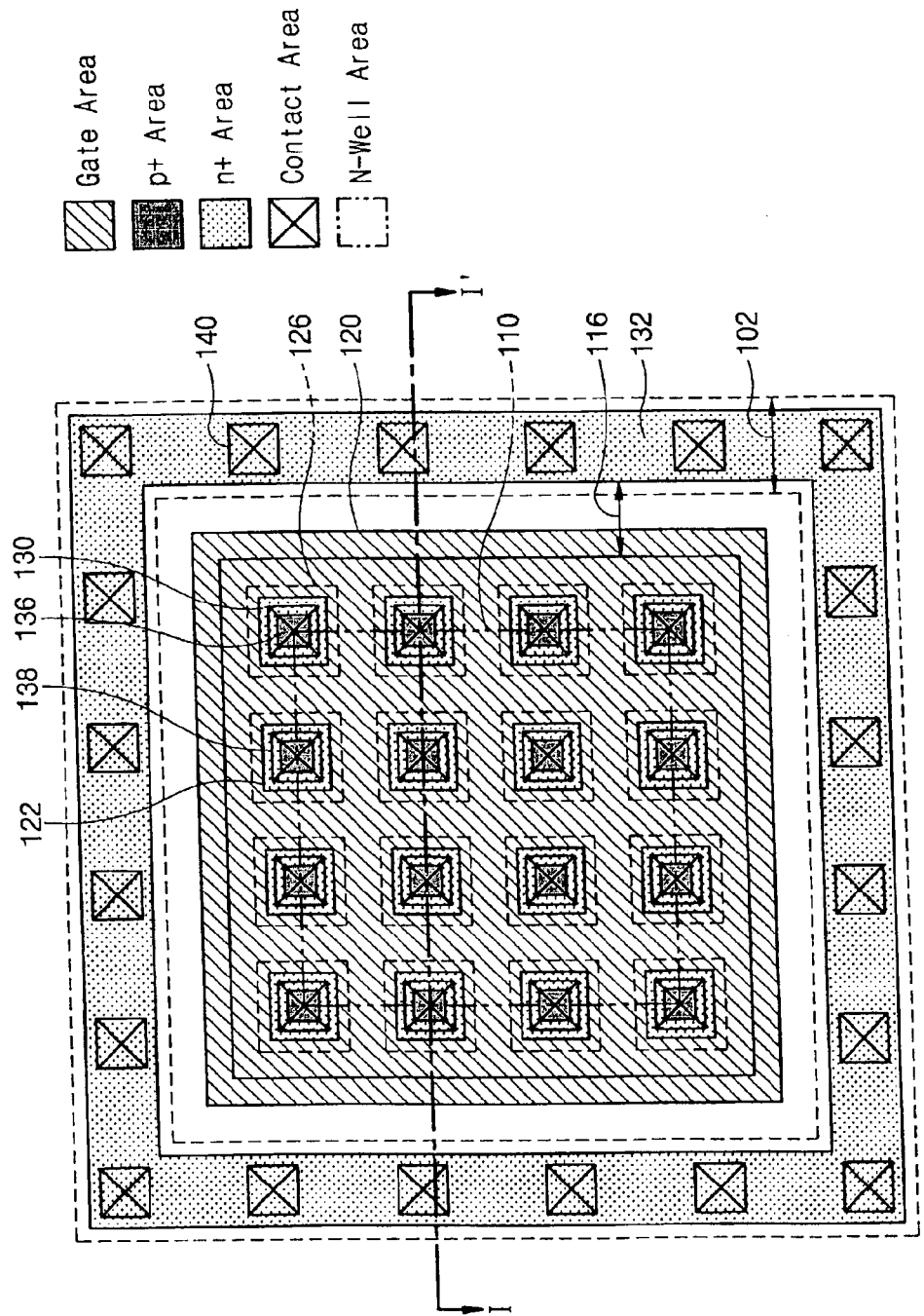

FIG. 2A is a cross-sectional view of a DMOS device according to a preferred embodiment of the present invention, and FIG. 2B is a top plan view thereof. Particularly, FIG. 2A is a cross-sectional view taken along a line II–II' of FIG. 2B. In this embodiment, an N-type DMOS device is illustrated by way of example.

Referring to FIG. 2A and FIG. 2B, a buried layer 104, which is heavily doped with N-type impurities, is formed over a P-type substrate 102. An N-type drift region 106 is formed on the buried layer 104 by means of conventional epitaxial growth.

A plurality of P-type body areas 126 are formed at a predefined areas of the drift region 106. A loop-shaped source region 130, which is heavily doped with N-type impurities, and a bulk area 136, which is heavily doped with P-type impurities, are formed in the body area 126.

An N-type well 110 includes at least a portion of the body areas 126 and is formed at the drift region 106. Preferably, an edge of the N-type well 110 partially overlaps the outermost body areas 126. However, the edge does not extend to a curvature portion 160 on which an electric filed concentrates. A doping density of the body area 126 is varied by the well 110. An outer body area 126a, which does not overlap the well 110, has a relatively high doping density as compared to an inner body area 126b overlapping the well 110.

A sink area 108 is formed apart from the outermost body areas 126, and is electrically connected to the buried layer 104 through the drift region 106. A field oxide layer 116 is formed between the sink area 108 and the outermost body area 126. The field oxide layer 116 is adjacent to the sink area 108.

A drain area 132 is heavily doped with N-type impurities and is formed on the sink area 108. The drain area 132 is loop-shaped with a constant width, as shown in FIG. 2B. A plurality of drain contacts 140 are formed at the drain area 132, and are connected to a drain electrode (not shown).

Returning to FIG. 2A, when a constant voltage is equivalently applied to a drain electrode and a gate electrode, electrons migrate from the source area 130 to the drain region 132 through a channel area 145, an accumulation region 147, the drift region 106, the buried layer 104, and the sink area 108.

In the DMOS device, the separate N-type well 110 is formed to surround the innermost body areas 126 and to partially overlap the outermost body areas 126. Due to the presence of the N-type well 100, resistances of the accumulation region 147 and the drift region 106 are lowered. Thus, the overall ON-resistance is also lowered. A breakdown voltage is not affected because the N-type well does not overlap the curvature outside the outermost body area. As a result, the breakdown voltage is not affected while lowering the ON-resistance. However, if the doping density of the N-type well 110 is too high, a breakdown may be generated between the body area 126b overlapping the N-type well 110 and the drift region 106. Therefore, it is desirable that the doping density of the N-type well 110 is higher than that of the drift region 106 and lower than that of the source region 130.

A method of fabricating a vertical DMOS device according to a preferred embodiment of the present invention will now be described with reference to FIG. 3A through FIG. 3I. In this embodiment, an N-type DMOS device is exemplarily described.

Figure 3A:
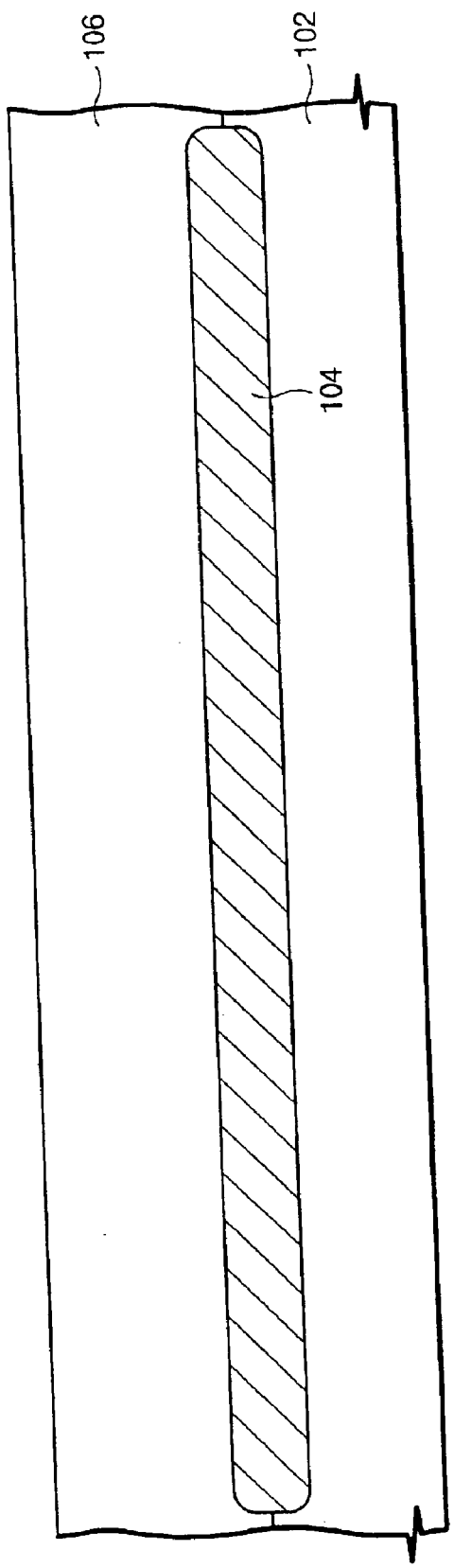

Referring to FIG. 3A, N-type impurities are implanted into a predetermined area of a P-type substrate 102. For example, phosphorous (P), arsenic (As) or antimony (Sb) ions may be implanted at a flux density of $1\times10^{14}/cm^2 \sim 5\times 10^{15}/cm^2$.

A drift region 106 which is lightly doped with N-type impurities is formed on the heavily doped N-type substrate 102 by conventional epitaxial growth. Heavily doped N-type impurities are diffused to an overlying layer to form an N-type buried layer 104, as shown in FIG. 3A.

Referring to FIG. 3B, a predetermined region of the drift region 106 is heavily doped by diffusion of N-type impurities to form a sink area 108 which is electrically connected to the N-type buried layer 104 through the drift region 106. For example, phosphorous (P), arsenic (As) or antimony (Sb) ions may be implanted at a flux density of $1\times10^{14}/cm^2 \sim 5\times10^{15}/cm^2$.

Figure 3C:
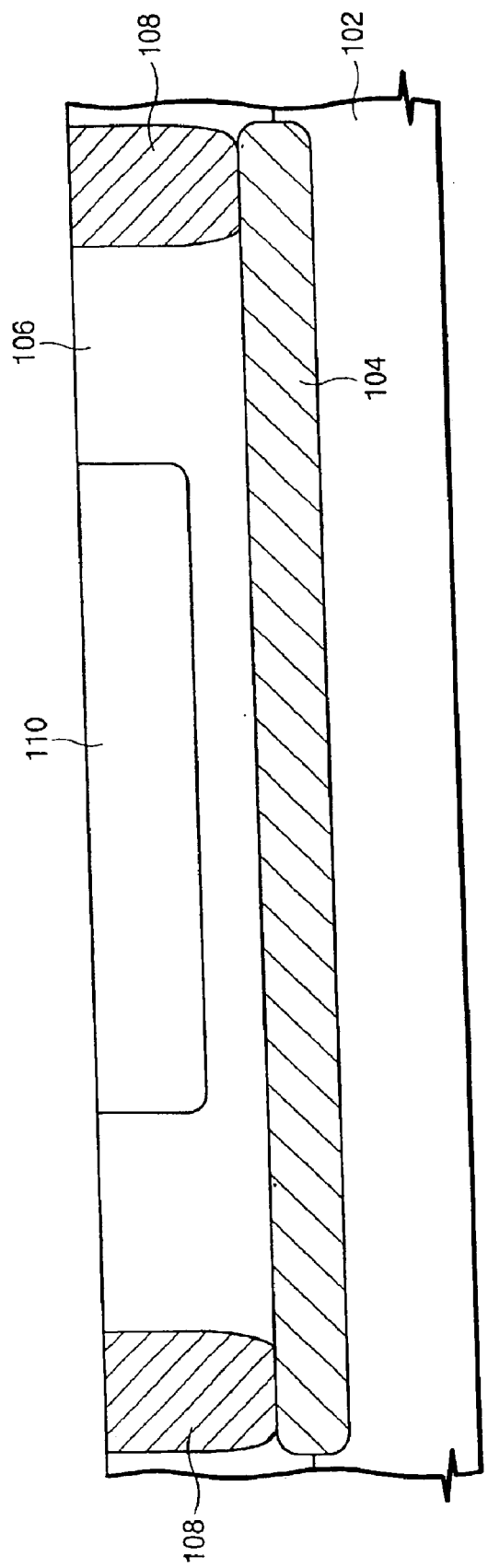

Referring to FIG. 3C, a predetermined area of the drift region 106 is doped with N-type impurities. That is, the N-type impurities are diffused to form an N-type well 110. The N-type well 110 serves to lower an ON-resistance by increasing a doping density of the predetermined area of the drift region 106. For example, phosphorous (P), arsenic (As) or antimony (Sb) ions may be implanted at a flux density of $5\times10^{11}/cm^2 \sim 5\times10^{13}/cm^2$.

Figure 3D:
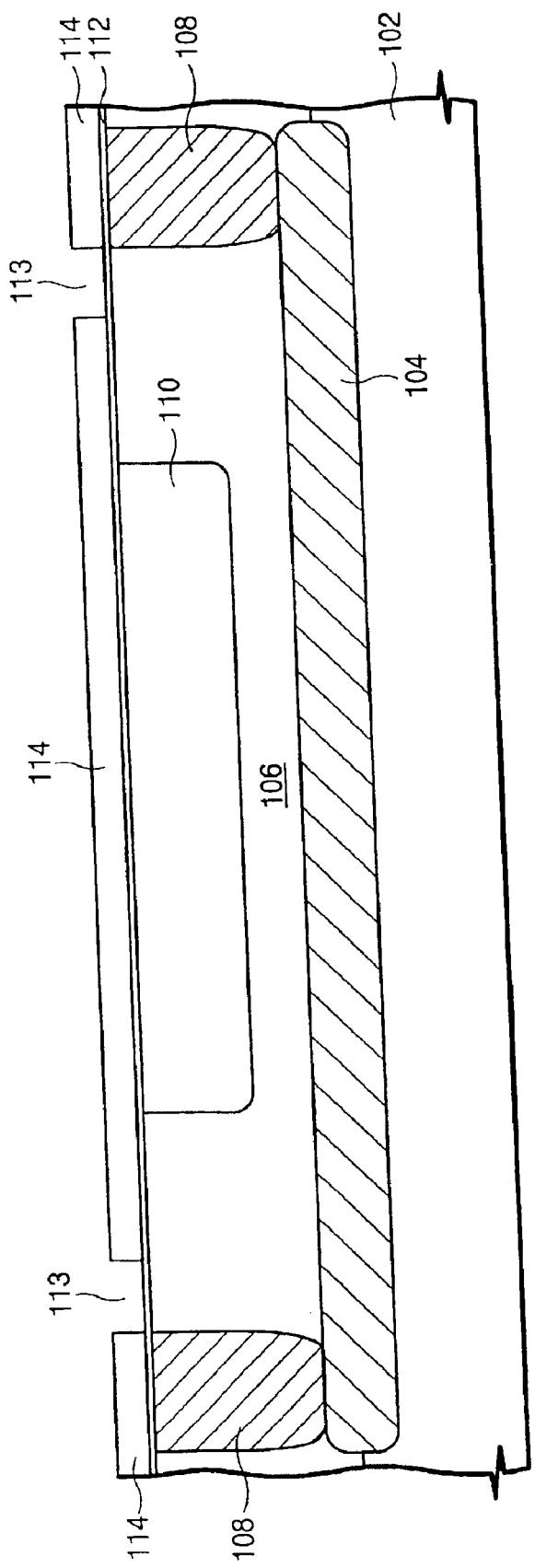

Referring to FIG. 3D, a pad oxide layer 112 and a silicon nitride layer 114 are formed on the drift region 106 where the sink area 108 and the N-type well 110 are formed. The silicon nitride layer 114 adjacent to the sink area 108 is removed to form an opening 113.

Figure 3E:
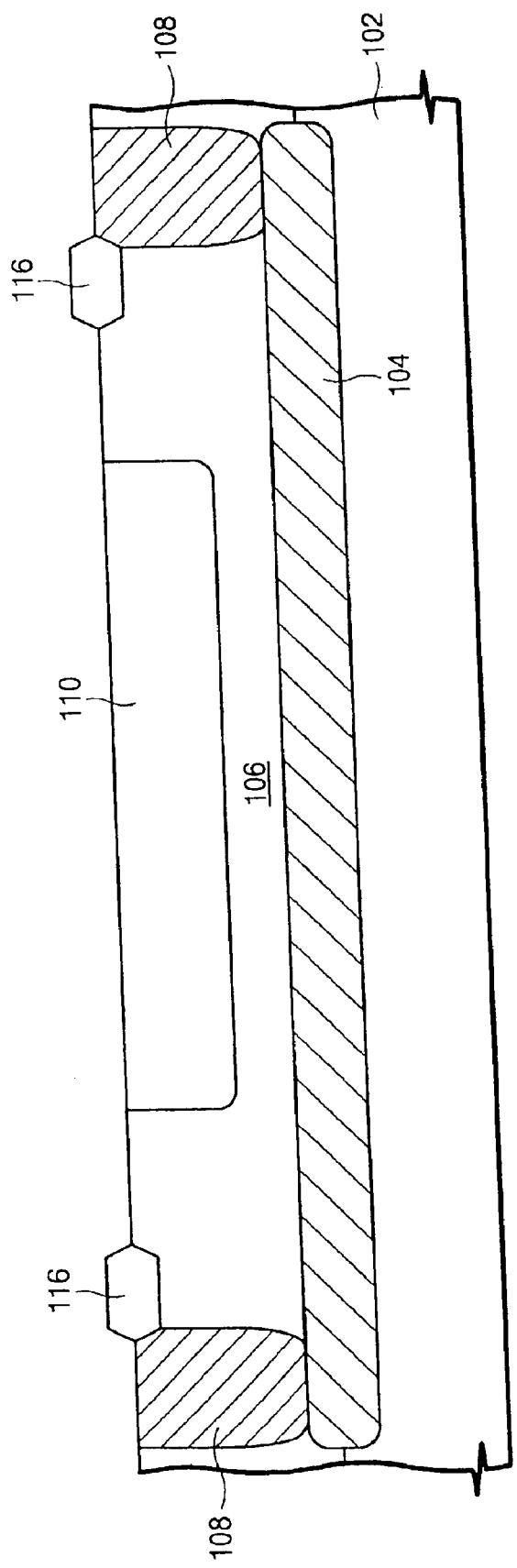

Referring to FIG. 3E, a semiconductor substrate is thermally oxidized to form a field oxide layer 116 in the opening 113 to a thickness of 1000 angstroms to 10000 angstroms. Thereafter, the silicon nitride layer 114 and the pad oxide layer 112 are removed. The field oxide layer 114 prevents a breakdown voltage from being lowered by the density of an electric field.

Figure 3F:
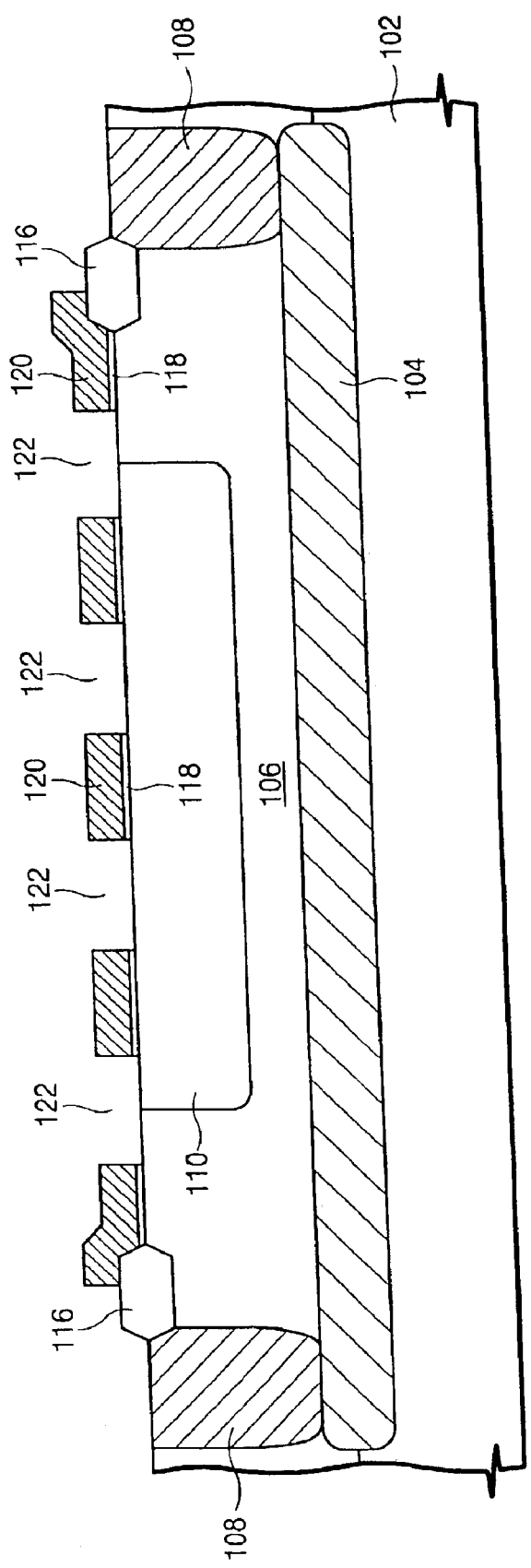

Referring to FIG. 3F, a gate insulating layer 118 and a gate conductive layer are formed on an entire surface of the semiconductor substrate including the field oxide layer 116. Using a photolithographic process, the gate insulating layer 118 and the gate conductive layer are patterned to form a gate electrode 120 having a mesh-shaped opening 122. An edge of the gate electrode 120 partially overlaps the field oxide layer 118.

Figure 3G:
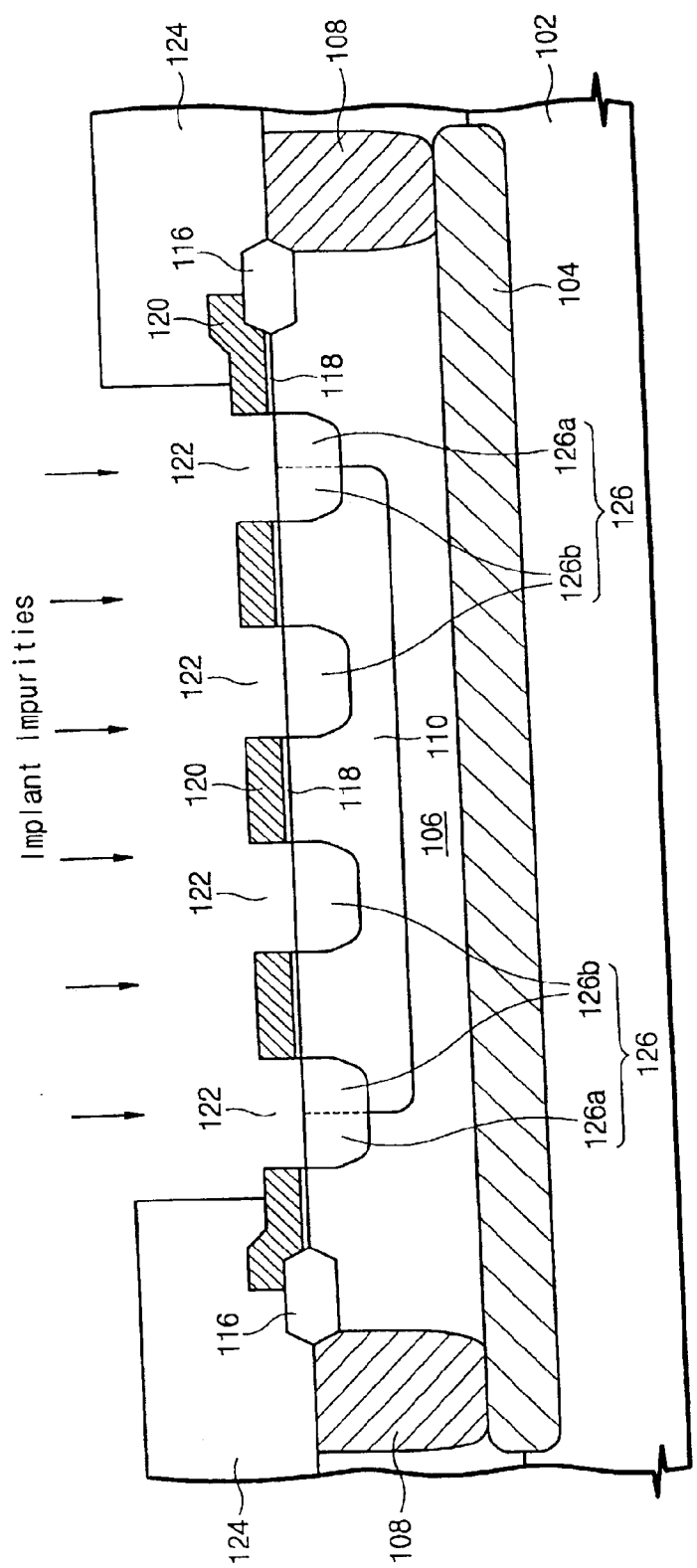

Referring to FIG. 3G, using a photoresist pattern 124 and the gate electrode 120 as an ion implanting mask, P-type impurities are implanted into the respective openings 122 formed between the gate electrodes 120 to form body areas 126. The photoresist pattern 124 is formed by a conventional photolithographic process. For example, boron (B), boron fluoride ($BF_2$) or indium (In) ions may be implanted at a flux density of $1\times10^{12}/cm^2 \sim 9\times10^{13}/cm^2$.

The body area 126 is formed in the previously formed N-type well 110. Further, an outermost body area is divided into a body area 126b formed in the N-type well and a body area 126a formed in the drift region 106 according to their doping densities. Since a doping density of the N-type well 110 is higher than that of the drift region 106, the doping density of the body area 126a is relatively higher than that of the body area 126b. Consequently, the body area 126b is maintained at the same breakdown voltage characteristic as a conventional device, while the body area 126b has a low threshold voltage Vth because its doping density is lower. Therefore, since a resistance of a channel area is lowered, and the ON-resistance is also lowered.

Figure 3H:
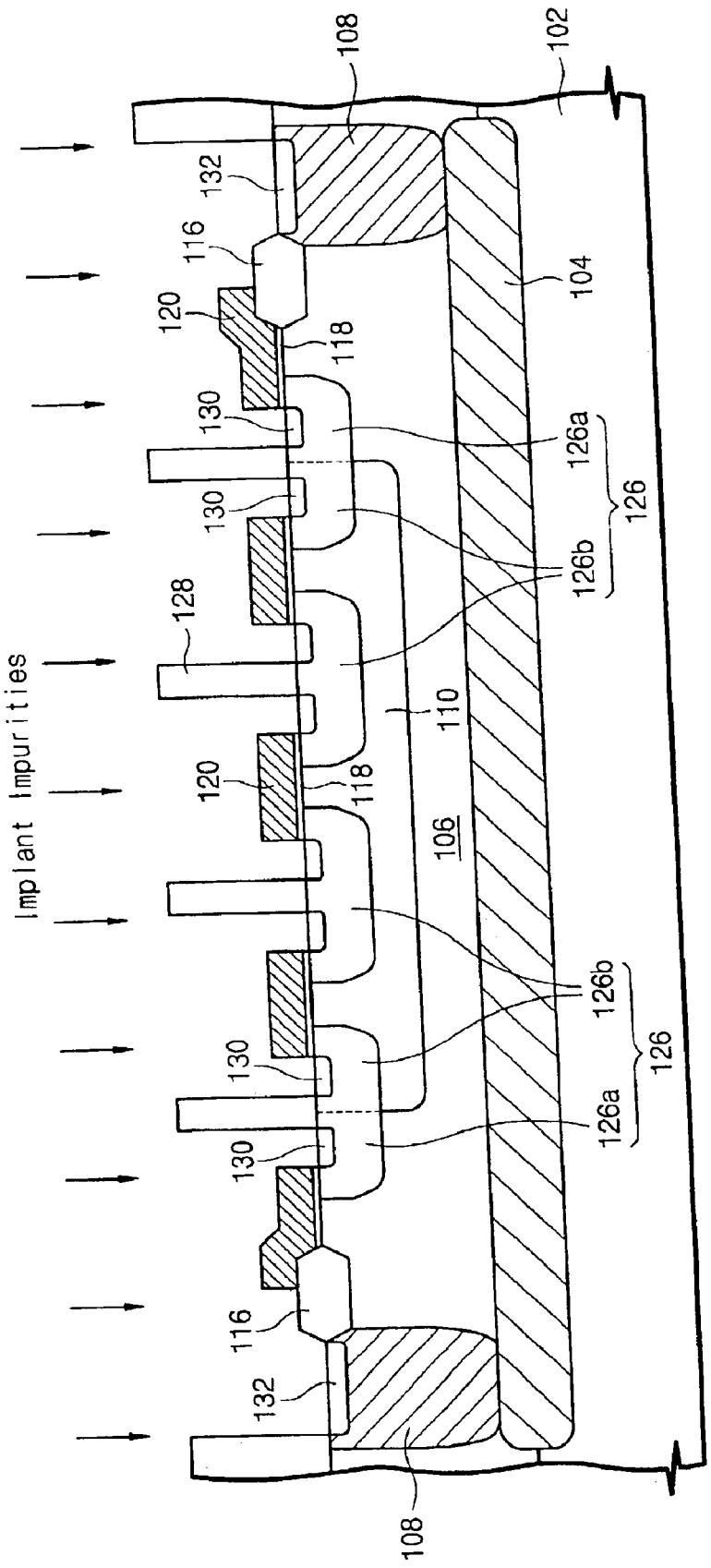

Referring to FIG. 3H, following removal of the photoresist pattern 124, a predetermined diffusion process is carried out to form a body area 126.

A conventional photolithographic process is performed to form a photoresist pattern 128 defining a source area and a drain area. Using the photoresist pattern 128, the gate electrode 120, and the field oxide layer 116 as an ion implanting mask, N-type impurities are heavily doped to form a source area 130 in the body area 126 and concurrently to form a drain area 132 in the sink area 108. For example, phosphorous (P), arsenic (As) or antimony (Sb) ions may be implanted at a flux density of $1\times10^{14}/cm^2 \sim 5\times10^{16}/cm^2$.

Referring to FIG. 3I, following removal of the photoresist pattern 128, the photolithographic process is re-performed to form a photoresist pattern 134 defining a bulk area. Using the photoresist pattern 134 as an ion implanting mask, a P-type bulk area 126 is formed. For example, boron (B), boron fluoride ($BF_2$) or indium (In) ions may be implanted at a flux density of $1\times10^{12}/cm^2 \sim 9\times10^{13}/cm^2$.

Following removal of the mask pattern 134, an annealing process is performed to form a DMOS structure shown in FIG. 2A.

An interlayer insulating film (not shown) is formed on an entire surface of a substrate. The interlayer insulating film is patterned by a photolithographic process to form a source contact 138 and a drain contact 140 shown in FIG. 2B. The source area 130 and the bulk area 136 are connected to a source electrode (not shown) through the source contact 138. The drain area 132 is connected to a drain electrode (not shown) through the drain contact 140.

The above embodiments, which are described as examples of the present invention, should not be construed as limiting of the invention. Various modifications or alterations can be easily made to the disclosed embodiment by those skilled in the art without departing from the scope of the present invention.

What is claimed is:

1. A DMOS device comprising:
    a substrate;
    a drift region located over the substrate and lightly doped with impurities of a first conductivity type;
    a plurality of body areas located in the drift region and doped with impurities of a second conductivity type which is opposite the first conductivity type;
    a plurality of source areas respectively located in the body areas and heavily doped with impurities of the first conductivity type;
    a plurality of bulk areas respectively located adjacent the source areas and in the body areas, and heavily doped with impurities of the second conductivity type; and
    a well region doped with impurities of the first conductivity type and wherein an edge of the well region partially overlaps the body area.

2. The DMOS device as claimed in claim 1, wherein the body areas include at least one innermost body area and a plurality of outermost body areas located outside a periphery of the at least one innermost body area.

3. The DMOS device as claimed in claim 1, wherein an impurity concentration of the well region is higher than that of the drift region and lower than that of the source areas.

4. The DMOS device as claimed in claim 3, further comprising:
    a buried layer of the first conductivity type interposed between the substrate and the drift region;
    a sink area spaced from the outermost body areas and electrically connected to the buried layer; and
    a drain area located on the sink area.

5. The DMOS device as claimed in claim 4, further comprising a gate electrode having a plurality of openings respectively aligned over the source areas and the bulk areas, and a gate insulating layer interposed between the drift region and the gate electrode.

6. The DMOS device as claimed in claim 5, further comprising a field oxide layer located adjacent the sink area and between the sink area and the outermost body areas.

7. The DMOS device as claimed in claim 6, wherein an outer edge of the gate electrode partially overlaps the field oxide layer.

8. The DMOS device as claimed in claim 5, wherein the gate electrode is polysilicon.

9. A DMOS device comprising:
    a substrate;
    a drift region located over the substrate and lightly doped with impurities of a first conductivity type;
    a plurality of body areas located in the drift region and doped with impurities of a second conductivity type which is opposite the first conductivity type;
    a plurality of source areas respectively located in the body areas and heavily doped with impurities of the first conductivity type;
    a plurality of bulk areas respectively surrounded by the source areas and located in the body areas, and heavily doped with impurities of the second conductivity type;
    a well region doped with impurities of the first conductivity type and wherein an edge of the well region partially overlaps the body area;
    a buried layer of the first conductively type interposed between the substrate and the drift region;
    a gate electrode having a plurality of openings respectively aligned over the source areas and the bulk areas;
    a gate insulating layer interposed between the drift region and the gate electrode;
    a sink area of the first conductivity type connected to the buried layer through the drift region; and
    a drain area of the first conductivity type located on the sink area.

10. The DMOS device as claimed in claim 9, wherein an edge of the well region partially overlaps at least one of body areas adjacent the sink area.

11. The DMOS device as claimed in claim 9, wherein impurity concentration of the well is higher than that of the drift region and lower than that of the source area.

12. The DMOS device as claimed in claim 9, wherein the opening is mesh-shaped.

13. The DMOS device as claimed in claim 9, further comprising a field oxide layer formed between the sink area and the outermost body area to be adjacent to the sink area.

14. The DMOS device as claimed in claim 13, wherein an edge of the gate electrode partially overlaps the field oxide layer.

15. The DMOS device as claimed in claim 1, wherein the portion of the area overlapped by the well region has a doping density less than the non-overlapping portion.

16. The DMOS device as claimed in claim 2, wherein the portion of the at least one body area which is overlapped by the well region has a doping density less than the non-overlapping portion.

17. The DMOS device as claimed in claim 9, wherein the portion of the area overlapped by the well region has a doping density less than an area not overlapped by the well region.

18. The DMOS device as claimed in claim 9, wherein the body areas include at least one innermost body area and a plurality of outermost body areas located outside a periphery of the at least one innermost body area, and wherein an outer edge of the well region partially overlaps the plurality of innermost body areas.

19. The DMOS device as claimed in claim 18, wherein the portion of the at least one body area which is overlapped by the well region has a doping density less than the non-overlapping portion.

* * * * *